(12) United States Patent
Harada et al.

(10) Patent No.: US 10,396,161 B2
(45) Date of Patent: Aug. 27, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yuichi Harada, Matsumoto (JP); Yasuyuki Hoshi, Matsumoto (JP); Akimasa Kinoshita, Matsumoto (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/283,950

(22) Filed: Oct. 3, 2016

(65) Prior Publication Data

US 2017/0025502 A1 Jan. 26, 2017

Related U.S. Application Data

(63) Continuation of application No. PCT/JP2015/072911, filed on Aug. 13, 2015.

(30) Foreign Application Priority Data

Sep. 8, 2014 (JP) .................................. 2014-182769

(51) Int. Cl.
*H01L 29/16* (2006.01)
*H01L 29/417* (2006.01)
(Continued)

(52) U.S. Cl.
CPC .... *H01L 29/1608* (2013.01); *H01L 21/02381* (2013.01); *H01L 21/02529* (2013.01);
(Continued)

(58) Field of Classification Search
CPC . H01L 29/665; H01L 29/861; H01L 29/7395; H01L 29/872; H01L 29/66068;
(Continued)

(56) References Cited

U.S. PATENT DOCUMENTS 4,417,387 A 11/1983 Heslop
6,821,886 B1 * 11/2004 Layadi .............. H01L 21/76805
257/751

(Continued)

FOREIGN PATENT DOCUMENTS

JP S56-164573 A 12/1981
JP 2012-129503 A 7/2012
(Continued)

*Primary Examiner* — Mohammed R Alam
(74) *Attorney, Agent, or Firm* — Rabin & Berdo, P.C.

(57) ABSTRACT

A semiconductor device having a silicon carbide (SiC) substrate, a SiC layer formed on a front surface of the SiC substrate, a first region selectively formed in the SiC layer at a surface thereof, a source region and a contact region formed in the first region, a gate insulating film disposed on the SiC layer and on a portion of the first region between the SiC layer and the source region, a gate electrode disposed on the gate insulating film above the portion of the first region, an interlayer insulating film covering the gate electrode, a source electrode electrically connected to the source region and the contact region, a drain electrode formed on a back surface of the SiC substrate, a first barrier film formed on, and covering, the interlayer insulating film, and a metal electrode formed on the source electrode and the first barrier film.

3 Claims, 5 Drawing Sheets

(51) Int. Cl.
*H01L 29/423* (2006.01)
*H01L 21/02* (2006.01)
*H01L 21/04* (2006.01)
*H01L 29/08* (2006.01)
*H01L 29/10* (2006.01)
*H01L 29/45* (2006.01)
*H01L 29/49* (2006.01)
*H01L 29/66* (2006.01)
*H01L 29/78* (2006.01)

(52) U.S. Cl.
CPC ...... *H01L 21/02634* (2013.01); *H01L 21/049* (2013.01); *H01L 21/0485* (2013.01); *H01L 29/0847* (2013.01); *H01L 29/1079* (2013.01); *H01L 29/417* (2013.01); *H01L 29/41741* (2013.01); *H01L 29/423* (2013.01); *H01L 29/45* (2013.01); *H01L 29/4966* (2013.01); *H01L 29/66068* (2013.01); *H01L 29/66484* (2013.01); *H01L 29/66666* (2013.01); *H01L 29/7827* (2013.01); *H01L 29/7831* (2013.01)

(58) Field of Classification Search
CPC ... H01L 29/45; H01L 29/7802; H01L 21/283; H01L 21/0485; H01L 21/8213; H01L 29/0839; H01L 29/4933; H01L 29/4975; H01L 21/265
See application file for complete search history.

(56) References Cited

U.S. PATENT DOCUMENTS

| | | | |
|---|---|---|---|
| 2010/0140697 A1* | 6/2010 | Yedinak | H01L 29/407 257/334 |
| 2010/0289997 A1 | 11/2010 | Suzuki | |
| 2011/0233666 A1* | 9/2011 | Lui | H01L 29/0638 257/334 |
| 2012/0132912 A1 | 5/2012 | Suekawa et al. | |
| 2013/0020587 A1 | 1/2013 | Hino et al. | |
| 2013/0062624 A1* | 3/2013 | Tsuchiya | H01L 29/0839 257/77 |
| 2013/0082285 A1 | 4/2013 | Kudou et al. | |
| 2014/0001472 A1 | 1/2014 | Furukawa et al. | |
| 2014/0299887 A1* | 10/2014 | Matocha | H01L 23/26 257/77 |

FOREIGN PATENT DOCUMENTS

| | | |
|---|---|---|
| JP | 2012-160485 A | 8/2012 |
| JP | 2013-058603 A | 3/2013 |
| WO | WO-2009/093602 A1 | 7/2009 |
| WO | WO-2011/125274 A1 | 10/2011 |
| WO | WO-2012/032735 A1 | 3/2012 |
| WO | WO-2012/086099 A1 | 6/2012 |

* cited by examiner

Conventional Art

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/072911 filed on Aug. 13, 2015 which claims priority from a Japanese Patent Application No. 2014-182769 filed on Sep. 8, 2014, the contents of which are incorporated herein by reference.

BACKGROUND OF THE INVENTION

1. Field of the Invention

The embodiments discussed herein relate to a semiconductor device and method of manufacturing a semiconductor device used as a switching device formed on a silicon carbide substrate.

2. Description of the Related Art

FIG. 13 is a cross-sectional view of a conventional metal-oxide-semiconductor field-effect transistor (MOSFET). An N-type SiC layer 2 is formed on a front surface side of an N-type silicon carbide (hereinafter, SiC) substrate 1, and plural P-type regions 3 are formed in a surface layer of the N-type SiC layer 2. An N-type source region 4 and a P-type contact region 5 are formed in the surface of the P-type regions 3. Further, a first gate electrode 7 and an interlayer insulating film 8 covering the first gate electrode 7 are formed via a gate insulating film 6, on a surface of the N-type SiC layer 2 and P-type region 3 between N-type source regions 4.

A first source electrode 9 is formed on a surface of the N-type source region 4 and the P-type contact region 5, and a second source electrode 11 is formed on a surface of the first source electrode 9. A drain electrode 12 is formed on a back surface side of the SiC substrate 1. A gate pad or gate runner is formed by a second gate electrode 22 and a second gate metal electrode 23 on an oxide film 21 of the front surface side of the SiC substrate 1. The second gate electrode 22 and the first gate electrode 7 are connected and when voltage is applied to the second gate metal electrode 23, the same voltage is applied to the first gate electrode 7.

In the MOSFET of the described structure, when a positive voltage with respect to the second source electrode 11 is applied to the drain electrode 12 and voltage less than the gate threshold is applied to the first gate electrode 7, PN junctions between the P-type regions 3 and the N-type SiC layer 2 are inversely biased and therefore, current does not flow. On the other hand, when voltage equal to or higher than the gate threshold is applied to the first gate electrode 7, on a surface of the P-type regions 3 directly under the first gate electrode 7, an inversion layer is formed and current flows. Thus, switching operation of the MOSFET may be performed by the voltage applied to the first gate electrode 7 (for example, refer to Japanese Patent Application Laid-Open Publication No. 2013-058603).

SUMMARY OF THE INVENTION

According to one aspect of the present invention, a semiconductor device includes a silicon carbide substrate of a first conductivity type; a silicon carbide layer of the first conductivity type, formed on a front surface side of the silicon carbide substrate and having a low concentration; a first region of a second conductivity type, selectively formed in a surface layer of the silicon carbide layer; a source region of the first conductivity type and a high concentration contact region of the second conductivity type formed in the first region; a gate insulating film disposed to contact a region of the first region between the silicon carbide layer and the source region; a gate electrode disposed on an opposite side of the first region, sandwiched by the gate insulating film; an interlayer insulating film covering the gate electrode; a source electrode electrically connected to a surface of the source region and the contact region; and a drain electrode formed on a back surface side of the silicon carbide substrate. The semiconductor device further includes a first barrier film covering the interlayer insulating film, and a second barrier film disposed at a second gate contact hole portion; and a metal electrode formed on each of the source electrode, the first barrier film, and the second barrier film.

In the semiconductor device, the first barrier film and the second barrier film are formed by a layered structure of TiN or, Ti and TiN, and surfaces of the first barrier film and the second barrier film are covered by Ti.

According to another aspect of the present invention, a method of manufacturing a semiconductor device including: a silicon carbide substrate of a first conductivity type; a silicon carbide layer of the first conductivity type, formed on a front surface side of the silicon carbide substrate and having a low concentration; a first region of a second conductivity type, selectively formed in a surface layer of the silicon carbide layer; a source region of the first conductivity type and a high concentration contact region of the second conductivity type formed in the first region; a gate insulating film disposed to contact a region of the first region between the silicon carbide layer and the source region; a gate electrode disposed on an opposite side of the first region, sandwiched by the gate insulating film; an interlayer insulating film covering the gate electrode; a source electrode electrically connected to a surface of the source region and the contact region; and a drain electrode formed on a back surface side of the silicon carbide substrate, includes forming a source contact hole and a gate contact hole concurrently; covering the gate contact hole and the interlayer insulating film by a barrier film having a layered structure of TiN or, Ti and TiN; and forming the source electrode by a nickel silicide layer after covering the gate contact hole and the interlayer insulating film.

The method further includes covering the nickel silicide layer formed as the source electrode, the nickel silicide layer being covered by a barrier film having a layered structure of TiN or, Ti and TiN.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor device and a method of manufacturing a semiconductor device will be described in detail with reference to the accompanying drawings.

Figure 1:
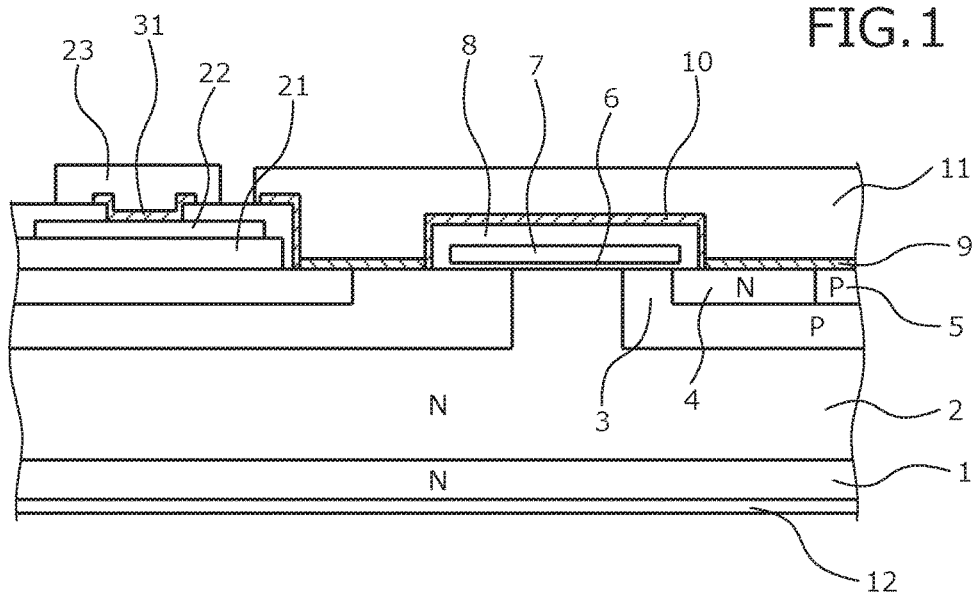
FIG. 1 is a cross-sectional view of a MOSFET in a first embodiment of a semiconductor device of the present invention.

FIG. 1 is a cross-sectional view of a MOSFET in a first embodiment of the semiconductor device of the present invention. In the present embodiments, although a first conductivity type is assumed to be an N-type and a second conductivity type is assumed to be a P-type, these types may be formed inversely.

An N-type SiC layer 2 having a low impurity concentration is formed on a front surface side of an N-type SiC substrate 1 and plural P-type regions 3 are formed in a surface layer of the N-type SiC layer 2. An N-type source region 4 and a P-type contact region 5 of a high impurity concentration are further formed in a surface layer of the P-type regions 3. A gate insulating film 6 is formed on a region from the N-type source region 4 through the P-type region 3 to the N-type SiC layer 2, and a first gate electrode 7 is formed by polysilicon on the gate insulating film 6.

An interlayer insulating film 8 is formed to cover the first gate electrode 7 and a first barrier film 10 of layered titanium nitride (TiN) or, titanium (Ti) and TiN is formed so as to cover the interlayer insulating film 8. A first source electrode 9 is formed of a nickel silicide on a surface of the N-type source region 4 and the P-type contact region 5. A second source electrode 11 of layered metals such as Ti and aluminum (Al), etc. is formed on the first barrier film 10 and the first source electrode 9. A drain electrode 12 is formed on a back surface side of the N-type SiC substrate 1.

In a region of the N-type SiC substrate 1, other than that of a device structure in which the first gate electrode 7 is formed, a second gate electrode 22 is formed of polysilicon on the oxide film 21; a gate pad formed by a second barrier film 31 formed of TiN, or Ti and TiN layered on the second gate electrode 22 and the second gate metal electrode 23 formed by metal such as Ti and Al, etc.; and a gate runner that is a metal layer for connecting the gate electrodes and a gate pad are formed. The second gate electrode 22 and the first gate electrode 7 are connected, and when voltage is applied to the second gate metal electrode 23, the same voltage is further applied to the first gate electrode 7.

The first barrier film 10 prevents penetration of Ni during sintering and further prevents short-circuit failures between the gate and source of the device. The second barrier film 31 covers a gate contact hole, suppresses reaction with the polysilicon of the first gate electrode 7, and stabilizes improvement of gate contact resistance and manufacturing processes.

Thus, surface metal electrode configuration differs according to location. A source contact portion has a layered structure of Ti and Al of the second source electrode 11 in a nickel silicide layer of the first source electrode 9. On a gate contact portion and the interlayer insulating film 8, a layered structure of Al and Ti of the second source electrode 11 is formed on Ti/TiN or Ti of the first barrier film 10.

In the described MOSFET, similar to a conventional MOSFET, voltage equal to or higher than the threshold voltage is applied to the gate electrode to form an inversion layer at the P-type region surface and turn on the MOSFET.

FIGS. 2, 3, 4, 5, and 6 are cross-sectional view of the MOSFET in the first embodiment of the semiconductor device of the present invention during manufacture. Manufacture of the MOSFET is performed sequentially from (a) to (f).

Figure 2:
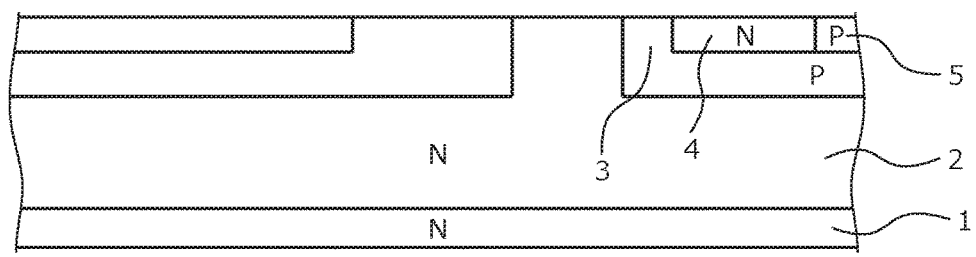
FIGS. 2, 3, 4, 5, and 6 are cross-sectional view of the MOSFET in the first embodiment of the semiconductor device of the present invention during manufacture.

(a) As depicted in FIG. 2, a device structure of the N-type SiC layer 2 to the P-type contact region 5 is formed in the N-type SiC substrate 1.

Figure 3:
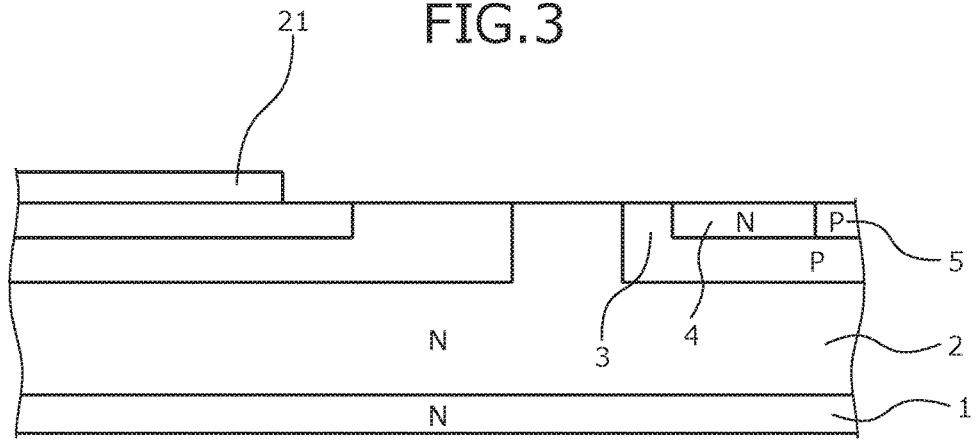

(b) As depicted in FIG. 3, in a region on the front surface of the N-type SiC substrate 1 and different from the region of the device structure, the oxide film 21 forming a gate pad, gate runner, etc. is formed to have a thickness of 0.5 μm or greater.

Figure 4:
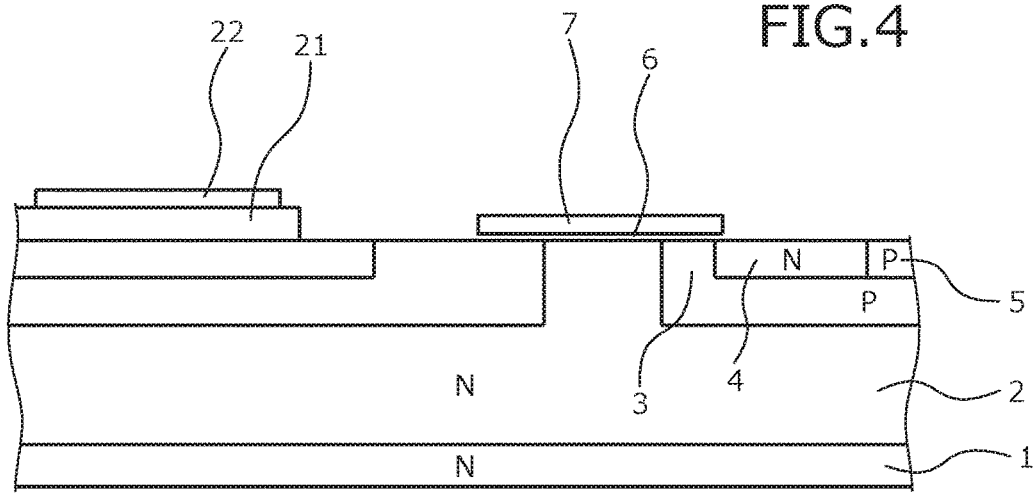

(c) As depicted in FIG. 4, the gate insulating film 6 is formed on a region from the N-type source region 4, through the P-type region 3 to the N-type SiC layer 2, by an oxide film having a thickness of about 0.1 μm. On the gate insulating film 6, the first gate electrode 7 is formed of polysilicon to have a thickness of 0.3 μm or greater and on the oxide film 21, the second gate electrode 22 is formed.

Figure 5:
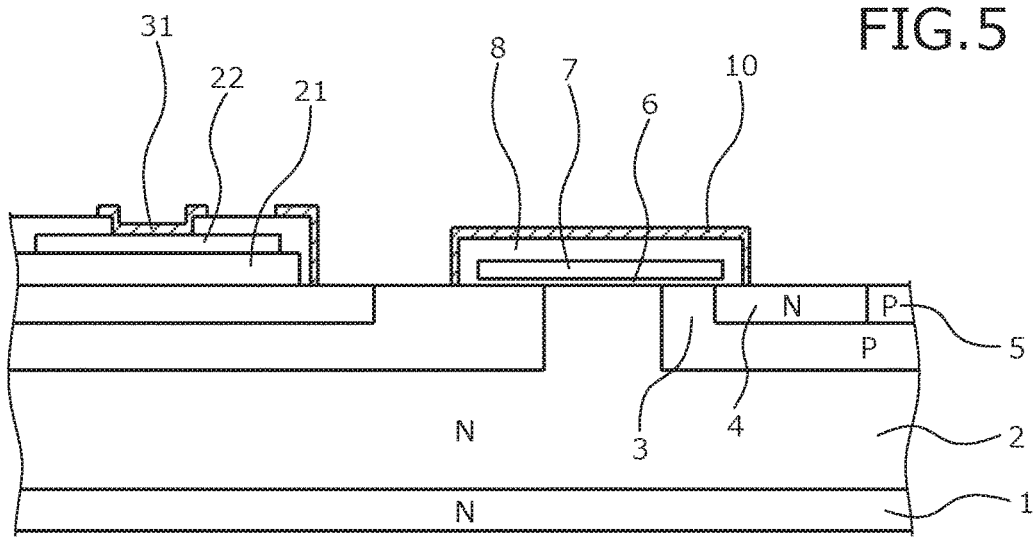

(d) As depicted in FIG. 5, on the first gate electrode 7, the interlayer insulating film 8 is formed of an oxide film of a thickness of 0.5 μm or greater, and a source and gate contact hole are formed. The first barrier film 10 is formed by a layered film of Ti/TiN or a single-layer film of TiN of a thickness of about 0.1 μm so as to cover the interlayer insulating film 8 and the second barrier film 31 is formed at the gate contact portion as well.

Figure 6:
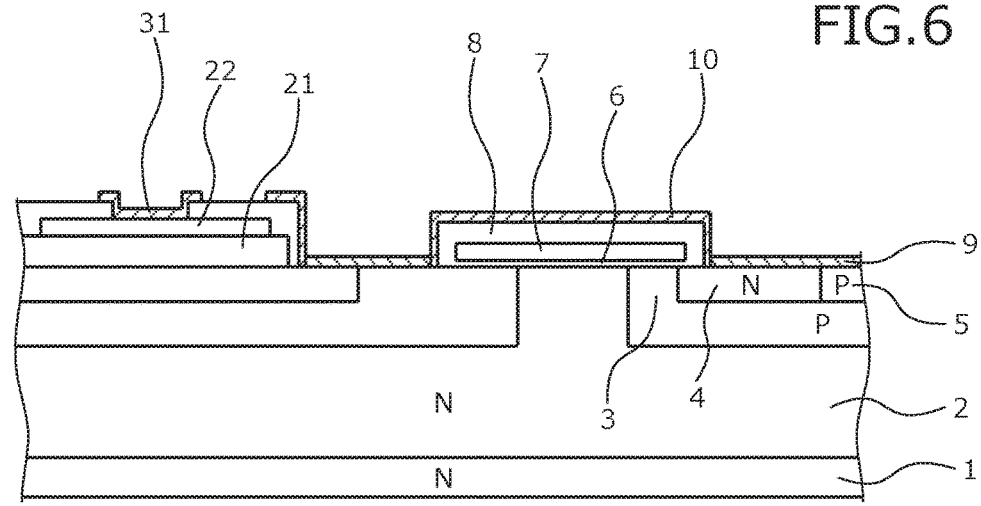

(e) As depicted in FIG. 6, at the source contact portion, the first source electrode 9 is formed by Ni of a thickness of about 0.05 μm.

(f) A sintering process at a temperature of 800 to 1200 degrees C. is performed and, the second source electrode 11 and the second gate metal electrode 23 are formed by a layered film of Ti and metal (Al, etc.) to have a thickness of 2.0 μm or greater. On the back surface side of the N-type SiC substrate 1, the drain electrode 12 is formed, whereby the MOSFET device structure depicted in FIG. 1 is obtained.

TiN used in the first barrier film 10 and the second barrier film 31 is susceptible to corrosion by rest potential and therefore, the surface has to be covered by metal. Here, although use of a single-layer film such as Al is effective, if gaps form in between with the TiN consequent to insufficient coverage, corrosion occurs consequent to oxidation of these gaps. To prevent this and ensure stable quality and reliability, the surface has to be cover with Ti. Although this Ti formation may be performed separately, the number of processes increases. Therefore, at process (f) above, at the time of formation of the second source electrode 11 and the second gate metal electrode 23, formation as layered metal electrodes using Ti enables the top of the TiN to be covered by Ti without increasing the number of processes.

Figure 7:
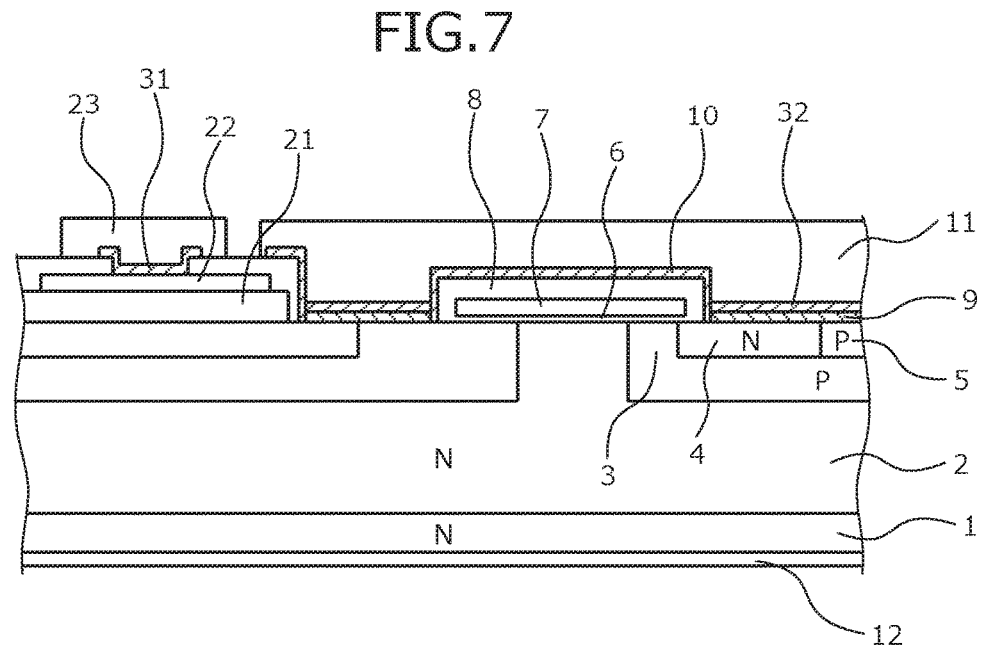
FIG. 7 is a cross-sectional view of the MOSFET in a second embodiment of the semiconductor device of the present invention.

FIG. 7 is a cross-sectional view of the MOSFET in a second embodiment of the semiconductor device of the present invention. The second embodiment differs from the first embodiment in that a third barrier film 32 is further formed on the first source electrode 9. This is applicable when the Ni of the first source electrode 9 is formed in the source-contact layer without contacting the interlayer insulating film 8 and there is no penetration of Ni during sintering and enables suppression of cracking of TiN consequent to the stress from the formation of the third barrier film 32 at the source contact portion and improved reliability of the element.

FIGS. 8, 9, 10, 11, and 12 are cross-sectional views of the MOSFET in the second embodiment during manufacture. Manufacture of the MOSFET is performed sequentially from (a) to (f).

Figure 8:
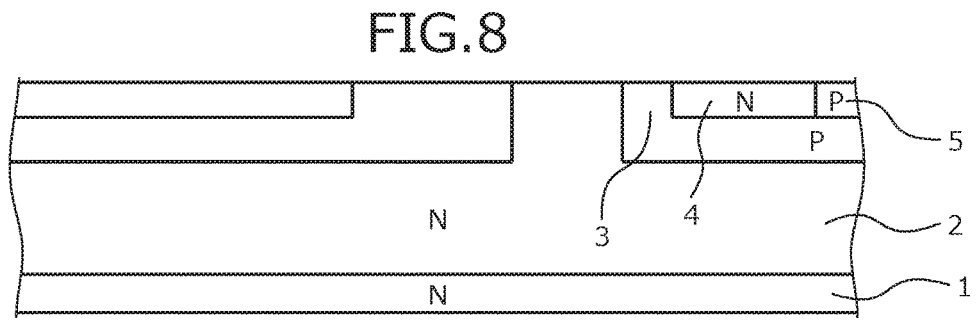
FIGS. 8, 9, 10, 11, and 12 are cross-sectional views of the MOSFET in the second embodiment during manufacture.

(a) As depicted in FIG. 8, a device structure of the N-type SiC layer 2 to the P-type contact region 5 is formed in the N-type SiC substrate 1.

Figure 9:
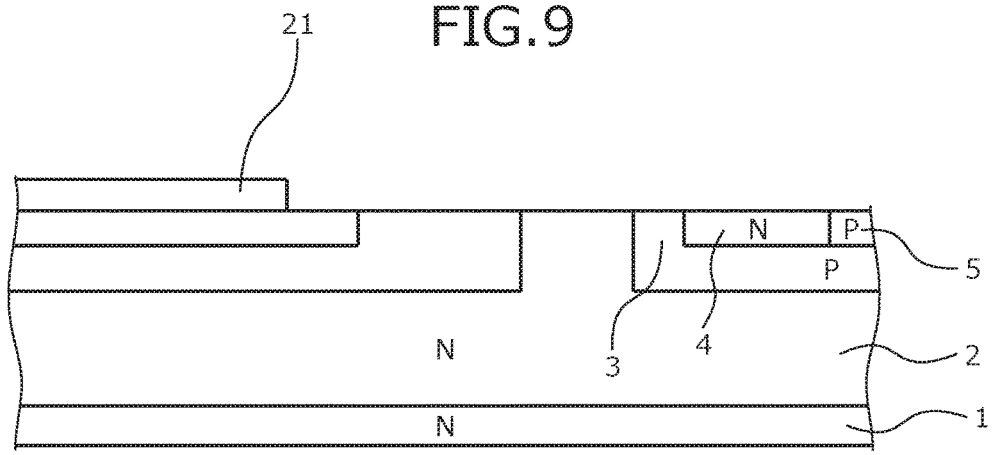

(b) As depicted in FIG. 9, in a region on the front surface of the N-type SiC substrate 1, different from the region of the device structure, the oxide film 21 forming a gate pad, gate runner, etc. is formed to have a thickness of 0.5 μm or greater.

Figure 10:
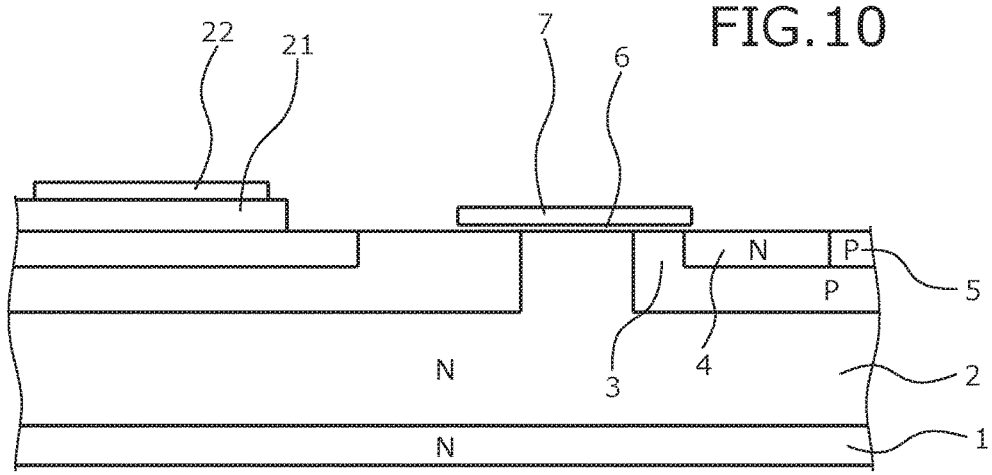

(c) As depicted in FIG. 10, the gate insulating film 6 is formed on a region from the N-type source region 4, through the P-type region 3 to the N-type SiC layer 2, by an oxide film having a thickness of about 0.1 μm. On the gate insulating film 6, the first gate electrode 7 is formed of polysilicon to have a thickness of 0.3 μm or greater and on the oxide film 21, the second gate electrode 22 is formed.

Figure 11:
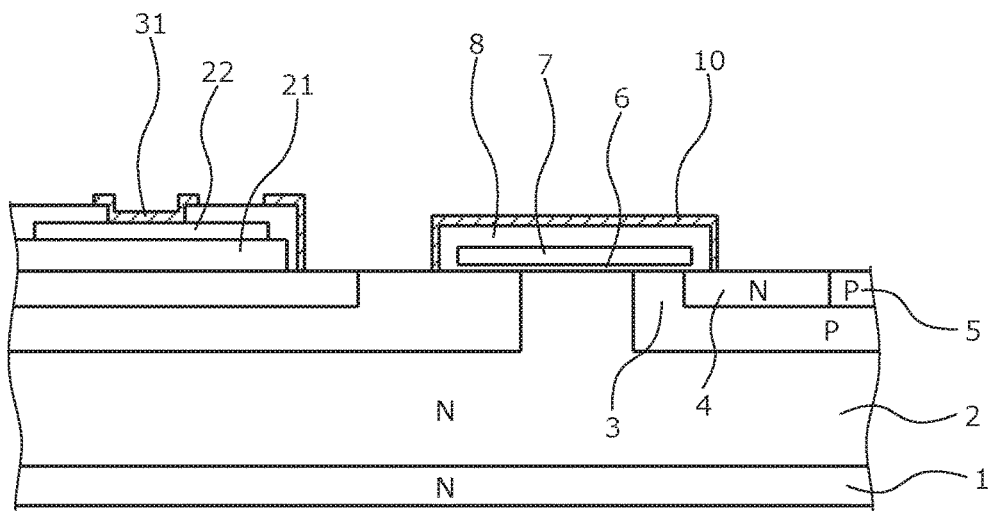

(d) As depicted in FIG. 11, on the first gate electrode 7, the interlayer insulating film 8 is formed of an oxide film of a thickness of 0.5 μm or greater, and a source and gate contact hole are formed. The first barrier film 10 is formed by a layered film of Ti/TiN or a single-layer film of TiN of a thickness of about 0.1 μm so as to cover the interlayer insulating film 8 and the second barrier film 31 is formed at the gate contact portion as well.

Figure 12:
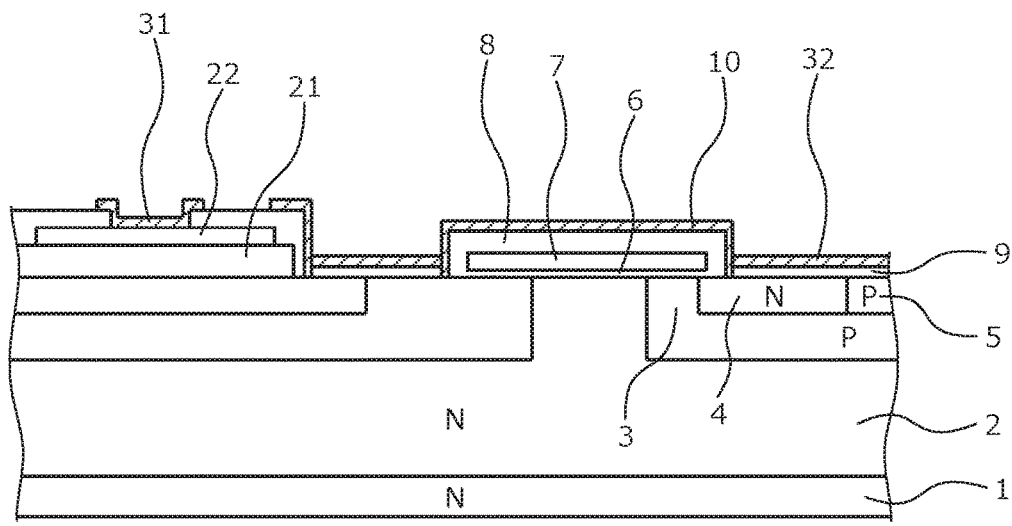
Figure 13:
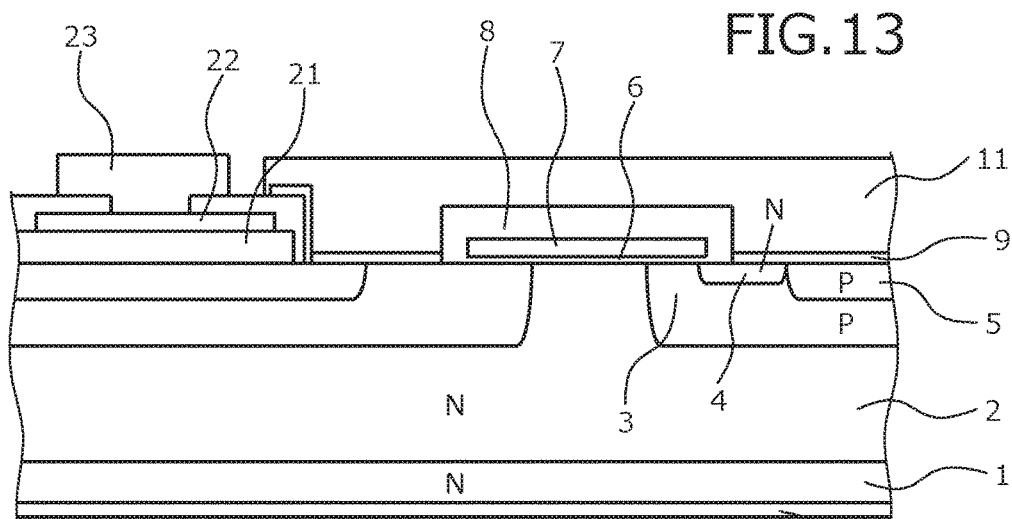
FIG. 13 is a cross-sectional view of a conventional MOSFET.

(e) As depicted in FIG. 12, at the source contact portion, the first source electrode 9 is formed by Ni to have a thickness of about 0.05 μm. At a source contact portion, the third barrier film 32 is further formed by a layered film of Ti/TiN or a single-layer film of TiN of a thickness of about 0.1 μm.

(f) A sintering process at a temperature of 800 to 1200 degrees C. is performed and, the second source electrode 11 and the second gate metal electrode 23 are formed by a layered film of Ti and metal (Al, etc.) to have a thickness of 2.0 μm or greater. On the back surface side of the N-type SiC substrate 1, the drain electrode 12 is formed, whereby the MOSFET device structure depicted in FIG. 7 is obtained.

In the MOSFET of the second embodiment as well, similar to the first embodiment, improvement of the gate contact resistance and process stabilization are facilitated, and TiN corrosion is prevented by covering the TiN with Ti, enabling stabilized quality and reliability to be ensured.

As described in the embodiments, even when the source contact hole and the gate contact hole are formed concurrently, during subsequent sintering, the gate contact hole is covered by a barrier film formed by a layered structure of TiN, or Ti and TiN, etc., whereby reaction with the polysilicon of the gate electrode is suppressed, enabling improved gate contact resistance and manufacturing process stabilization. Here, the metal used in the electrodes is susceptible to corrosion consequent to the effects of electric potential and humidity during operation of the MOSFET. Corrosion occurs easily in the sequence of TiN>Ti>Al, Al—Si. Thus, TiN surfaces, which are most susceptible to corrosion, are covered by Ti, whereby corrosion of TiN is prevented and, stabilization of contact resistance and MOSFET characteristics, and reliability may be improved. Further, covering the interlayer insulating film by a barrier film suppresses Ni penetration into the interlayer insulating film during sintering and even when Ni residue is present, unfavorable occurrences such as decrease of the dielectric breakdown voltage and short circuit between the gate and source are suppressed, enabling stabilization of characteristics and improved reliability.

Thus, gate-contact formation and source-contact formation may be performed concurrently, and gate-contact improvement and process stabilization becomes possible. Further, covering the TiN of the barrier film with Ti enables corrosion of the TiN to be prevented and ensures stabilized quality and reliability.

Further, the invention is not limited to a vertical MOSFET and is similarly applicable to a MOSFET having a trench structure.

In contrast, when the MOSFET of the conventional structure is formed, the first source electrode 9 is formed of a nickel (Ni) silicide to reduce the contact resistance. At a process of concurrently forming the source contact hole and the gate contact hole of the gate pad or gate runner portion, during heat treatment at 1000 degrees C. (hereinafter, sintering) to form the nickel silicide, when Ni is formed at the gate contact hole, polysilicon forming the second gate electrode 22 and the Ni react, putting polysilicon in a degraded and fragile state.

Further, even when the polysilicon is exposed without forming Ni at the gate contact portion, the polysilicon surface reacts with gases in the atmosphere, degrades and enters a similar fragile state. In this manner, when the polysilicon surface degrades, the gate contact becomes insufficient. Further, when Ni residue is present on the interlayer insulating film 8, the Ni penetrates inside the interlayer insulating film 8 during sintering, short circuit between the gate and source occurs, and dielectric breakdown voltage decreases.

According to the embodiments, the gate contact may be formed concurrently with the source contact and improved gate contact and process stabilization becomes possible. Further, covering the TiN of the barrier film with Ti enables corrosion of the TiN to be prevented and ensures stabilized quality and reliability.

According to the present invention, the gate contact may be improved.

As described, the semiconductor device and the method of manufacturing a semiconductor device according to the present invention are useful for high-voltage semiconductors used in used in power converting equipment, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising: a silicon carbide (SiC) substrate of a first conductivity type, having a front surface and a back surface; a SiC layer of the first conductivity type, formed on the front surface of the SiC substrate and having an impurity concentration lower than that of the SiC substrate; a first region of a second conductivity type, selectively formed in the SiC layer at a surface thereof; a source region of the first conductivity type formed in the first region; a contact region of the second conductivity type formed in the first region, the contact region having an impurity concentration higher than that of the first region; a gate insulating film disposed on the SiC layer and on a portion of the first region between the SiC layer and the source region; a first gate electrode disposed on the gate insulating film above the portion of the first region; an interlayer insulating film covering the first gate electrode; a source electrode electrically connected to the source region and the contact region; a drain electrode formed on the back surface of the SiC substrate; a first barrier film formed on and covering the interlayer insulating film, interposing the source electrode and the interlayer insulating film, the first barrier film separating the source electrode from the interlayer insulating film, so as to prevent penetration of metal atoms of the source electrode into the interlayer insulating film; and a first metal electrode formed directly on the source electrode and the first barrier film, wherein the first barrier film is formed by a single-layer structure of titanium nitride (TiN), or a layered structure of titanium (Ti) and TiN, and the first metal electrode is formed by a layered structure of Ti and aluminum (Al).

2. The semiconductor device according to claim 1, further comprising:
   an oxide film formed on the SiC substrate;
   a second gate electrode formed on the oxide film;
   a gate contact hole formed on the second gate electrode;
   a second barrier film disposed in the gate contact hole; and
   a second metal electrode formed on the second barrier film.

3. The semiconductor device according to claim 2, wherein
   the second barrier film is formed by the single-layer structure of TiN, or the layered structure of Ti and TiN, and
   a surface of the second barrier film is covered by Ti.

* * * * *